(12) United States Patent
Yanagisawa et al.

(10) Patent No.: US 11,309,195 B2
(45) Date of Patent: Apr. 19, 2022

(54) HEATING ELEMENT, SUBSTRATE PROCESSING APPARATUS AND METHOD OF MANUFACTURING SEMICONDUCTOR DEVICE

(71) Applicant: KOKUSAI ELECTRIC CORPORATION, Tokyo (JP)

(72) Inventors: Yoshihiko Yanagisawa, Toyama (JP); Yukitomo Hirochi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 105 days.

(21) Appl. No.: 16/549,362

(22) Filed: Aug. 23, 2019

(65) Prior Publication Data

US 2019/0378731 A1  Dec. 12, 2019

Related U.S. Application Data

(63) Continuation of application No. PCT/JP2017/011735, filed on Mar. 23, 2017.

(51) Int. Cl.
| | |
|---|---|
| *H05B 6/64* | (2006.01) |
| *H01L 21/67* | (2006.01) |
| *H01L 21/673* | (2006.01) |

(52) U.S. Cl.
CPC .. *H01L 21/67115* (2013.01); *H01L 21/67313* (2013.01)

(58) Field of Classification Search
CPC ......... H01L 21/67069; H01L 21/67098; H01L 21/67115; H01L 21/67103; H01L 21/67109; H01L 21/6719; H01L 21/67248; H01L 21/67253; H01L 21/67309; H01L 21/67313; H01L 21/67742;
(Continued)

(56) References Cited

U.S. PATENT DOCUMENTS

| | | |
|---|---|---|
| 2009/0008362 A1 | 1/2009 | Matsuo |
| 2011/0226759 A1* | 9/2011 | Wander ................. H05B 6/806 |
| | | 219/702 |

(Continued)

FOREIGN PATENT DOCUMENTS

| | | |
|---|---|---|
| JP | 01-216522 A | 8/1989 |
| JP | 2009-016540 A | 1/2009 |

(Continued)

OTHER PUBLICATIONS

Japanese Office Action dated Oct. 9, 2020 for Japanese Patent Application No. 2019-506833.

*Primary Examiner* — Hung D Nguyen
(74) *Attorney, Agent, or Firm* — Volpe Koenig

(57) ABSTRACT

Described herein is a technique capable of processing a substrate uniformly using microwaves. According to one aspect of the technique of the present disclosure, there is provided a heating element used in a substrate processing apparatus configured to heat a substrate supported by a substrate retainer by microwaves and process the substrate, the heating element including a dielectric material of an annular shape capable of generating heat by the microwaves. An inner circumferential portion of the heating element is located outer than an outer circumferential portion of the substrate, and the heating element is supported by the substrate retainer without contacting the substrate.

18 Claims, 13 Drawing Sheets

(58) Field of Classification Search
CPC ......... H01L 21/67748; H01L 21/67781; H01L 21/68735; H05B 6/6411; H05B 6/645; H05B 6/6482; H05B 6/6491; H05B 6/80; H05B 6/806
USPC ........ 219/678, 752, 753, 756, 759, 762, 763
See application file for complete search history.

(56) References Cited

U.S. PATENT DOCUMENTS

2014/0117009 A1    5/2014  Yamamoto
2014/0308028 A1* 10/2014  Mashimo .......... H01L 21/67115
                                                392/416

FOREIGN PATENT DOCUMENTS

| JP | 2014-090058 A | 5/2014 |
| JP | 2015-070045 A | 4/2015 |
| JP | 2016-186991 A | 10/2016 |

* cited by examiner

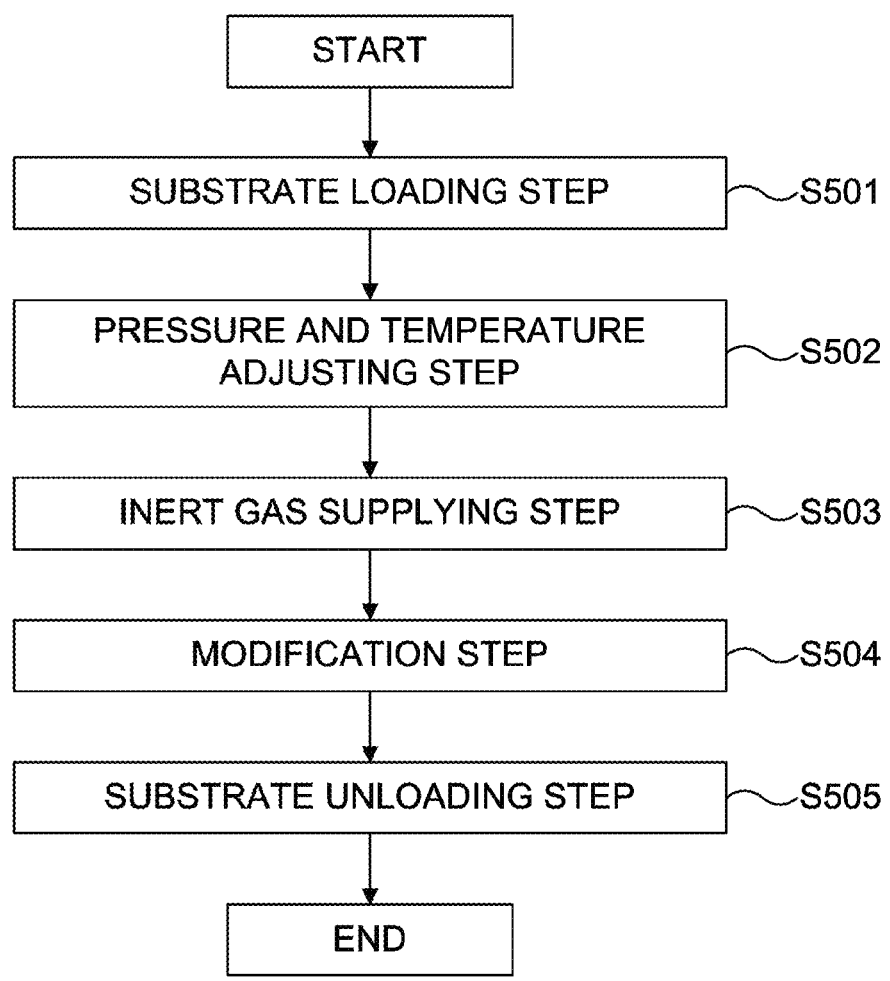

HEATING ELEMENT, SUBSTRATE PROCESSING APPARATUS AND METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of International Application No. PCT/JP2017/011735, filed on Mar. 23, 2017, in the WIPO, the entire contents of which are hereby incorporated by reference.

BACKGROUND

1. Field

The present disclosure relates to a heating element, a substrate processing apparatus and a method of manufacturing a semiconductor device.

2. Description of the Related Art

As one of manufacturing processes of a semiconductor device, a modification process such as an annealing process may be performed. For example, the annealing process is performed by heating a substrate in a process chamber by using a heating apparatus to change compositions and crystal structures of a film formed on a surface of the substrate or to restore defects such as crystal defects in the film. Recently, semiconductor devices are integrated at a high density and remarkably miniaturized. As a result, it is required to provide a modification process capable of modifying a high density substrate on which a pattern is formed with a high aspect ratio. As the modification process capable of modifying the high density substrate, a heat treatment using microwaves (also referred to as "electromagnetic waves") may be performed.

However, in a conventional process such as the heat treatment using the microwaves, the microwaves may be concentrated on an edge portion of a component provided in the process chamber (for example, an edge portion of the substrate). As a result, an edge effect that the edge portion is overheated (that is, heated excessively) may occur. Therefore, it may be difficult to process the substrate uniformly.

SUMMARY

Described herein is a technique capable of processing a substrate uniformly using microwaves.

According to one aspect of the technique of the present disclosure, there is provided a heating element used in a substrate processing apparatus configured to heat a substrate supported by a substrate retainer by microwaves and process the substrate, the heating element including a dielectric material of an annular shape capable of generating heat by the microwaves, wherein an inner circumferential portion of the heating element is located outer than an outer circumferential portion of the substrate, and the heating element is supported by the substrate retainer without contacting the substrate.

BRIEF DESCRIPTION OF THE DRAWINGS

FIG. 5 is a flow chart schematically illustrating a substrate processing according to the embodiments described herein.

DETAILED DESCRIPTION

Embodiments

Hereinafter, one or more embodiments (hereinafter, simply referred to as "embodiments") according to the technique of the present disclosure will be described with reference to the drawings.

(1) Configuration of Substrate Processing Apparatus

Figure 3:
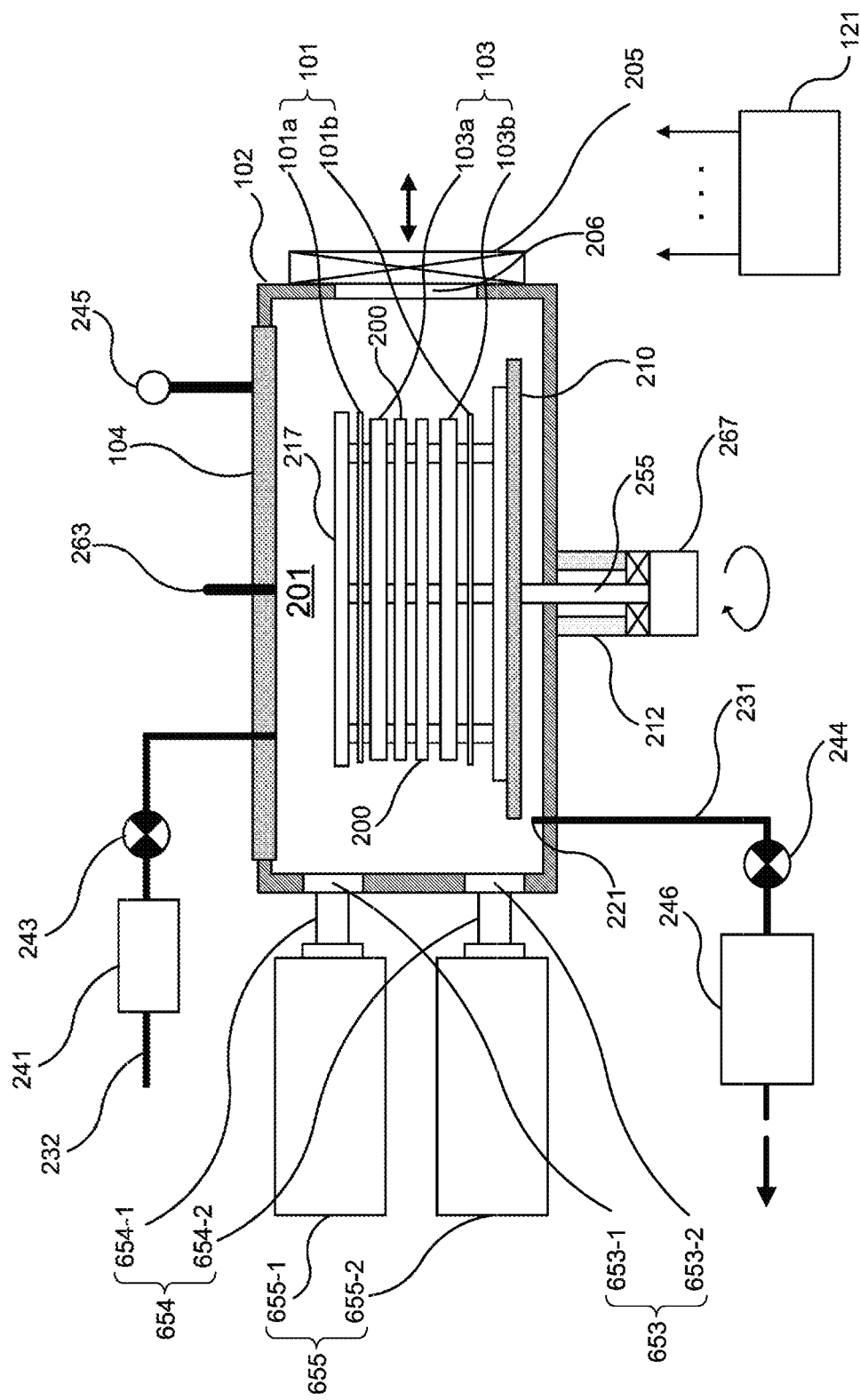
FIG. 3 schematically illustrates a vertical cross-section of a process furnace of the substrate processing apparatus preferably used in the embodiments.

The embodiments will be described by way of an example in which a substrate processing apparatus 100 is configured as a heat treatment apparatus that performs various kinds of heat treatments on a wafer 200 or a plurality of wafers (for example, two wafers as shown in FIG. 3) including the wafer 200 simultaneously. For example, in the embodiments, the substrate processing apparatus 100 is configured as an apparatus capable of performing an annealing process (for example, a modification process) using electromagnetic waves as described later. In the substrate processing apparatus 100 according to the embodiments, a FOUP (Front Opening Unified Pod, hereinafter, also referred to as a "pod") 110 is used as a storage container (also referred to as a "carrier") in which the plurality of the wafers including the wafer 200 serving as a substrate is accommodated. The pod 110 is also used as a transfer container when the wafer 200 is transferred between various substrate processing apparatuses including the substrate processing apparatus 100.

Figure 1:
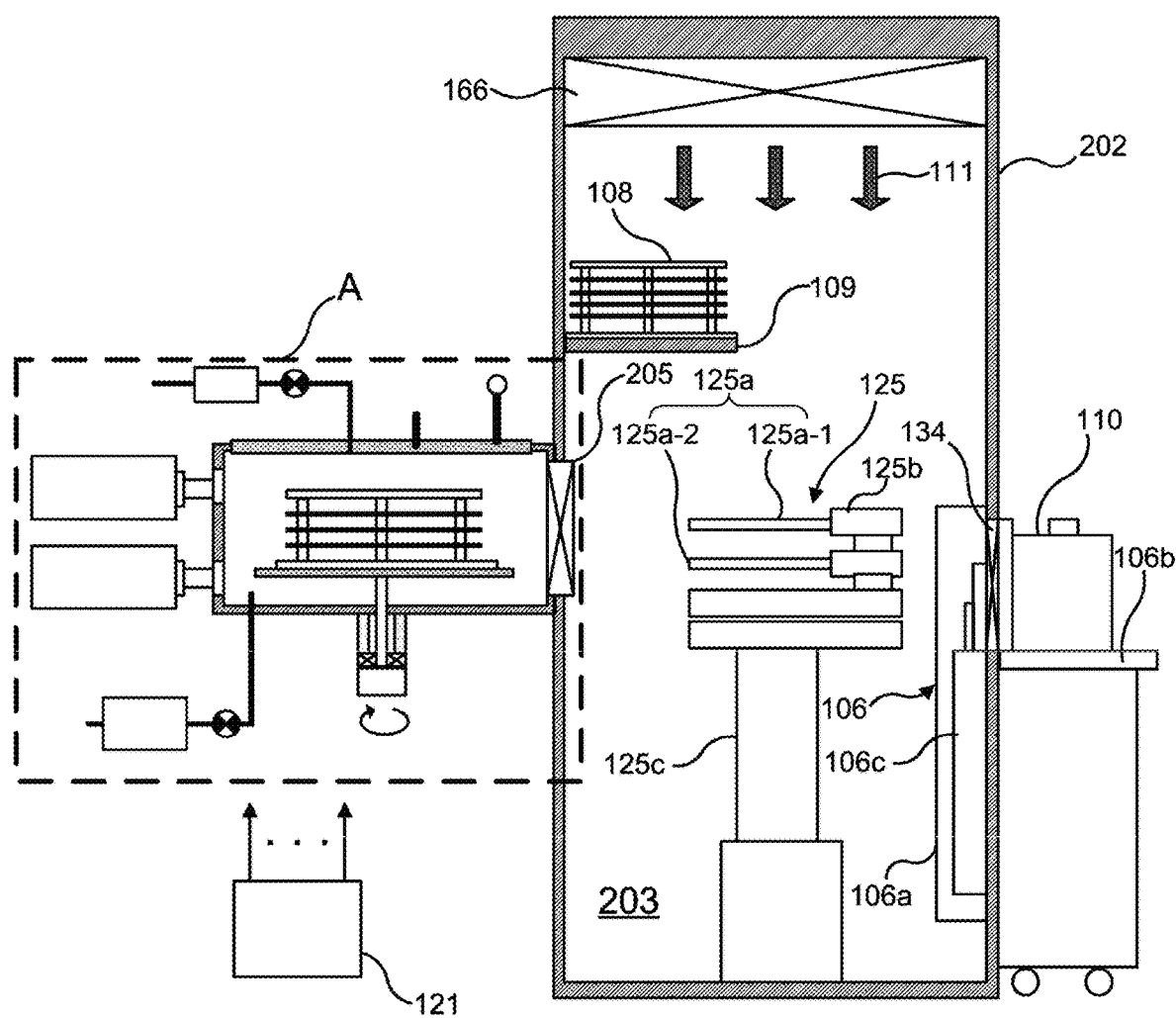
FIG. 1 schematically illustrates a vertical cross-section of a substrate processing apparatus preferably used in one or more embodiments described herein.
Figure 2:
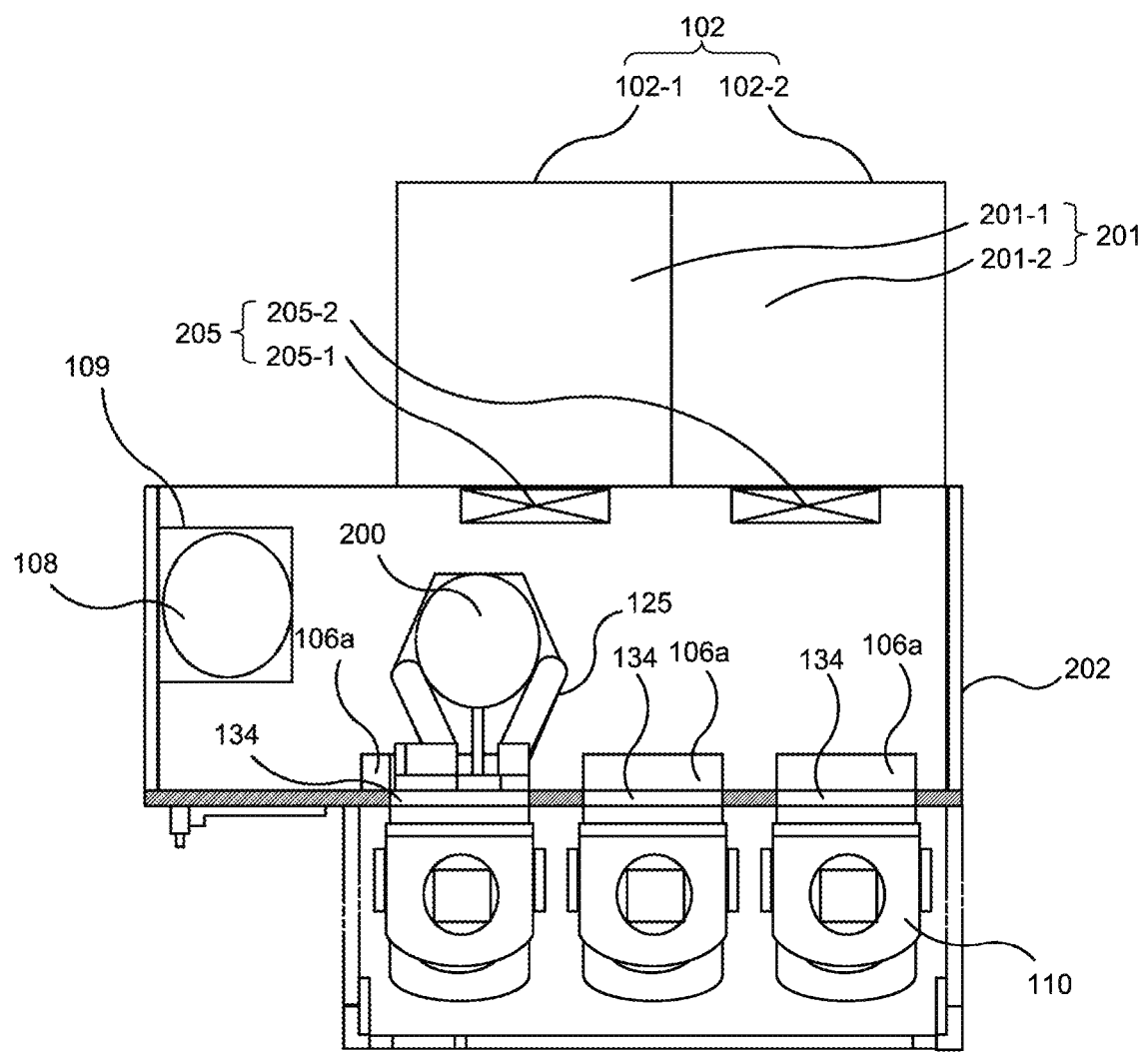
FIG. 2 schematically illustrates a horizontal cross-section of the substrate processing apparatus preferably used in the embodiments described herein.

As shown in FIGS. 1 and 2, the substrate processing apparatus 100 includes: a transfer housing 202 with a transfer chamber (also referred to as a "transfer region") 203 provided therein; and cases 102-1 and 102-2 with process chambers 201-1 and 201-2 provided therein, respectively. The wafer 200 is transferred to or from the transfer chamber 203. The cases 102-1 and 102-2 are provided on a side wall of the transfer housing 202. The cases 102-1 and 102-2 serve as a process vessel which will be described later, respectively. For example, the plurality of the wafers including the wafer 200 is processed in the process chambers 201-1 and 201-2, respectively. A loading port mechanism (also referred to as an "LP") 106 serving as a pod opening/closing mechanism capable of opening and closing a cover of the pod 100, transferring (loading) the wafer 200 into the transfer chamber 203 and transferring (unloading) the wafer 200 from the transfer chamber 203 is provided at a front side of the transfer housing 202 of the transfer chamber 203. That is, the loading port mechanism 106 is shown in a right portion of FIG. 1 (a lower portion of FIG. 2). The loading port mechanism 106 includes a housing 106a, a stage 106b and an opener 106c. The stage 106b is configured to transfer the pod 110 to a position close to a substrate loading/unloading port 134 provided in front of the transfer housing 202 of the transfer chamber 203 while the pod 110 is placed on the stage 106b. The opener 106c is configured to open and close the cover (not shown) provided in the pod 110. The transfer housing 202 includes a purge gas circulation structure provided with a cleaning mechanism 166. The purge gas circulation structure is configured to circulate a purge gas such as $N_2$ gas in the transfer chamber 203.

Gate valves 205-1 and 205-2 capable of opening and closing the process chambers 201-1 and 201-2 are provided at a rear side of the transfer housing 202 of the transfer chamber 203, respectively. That is, the gate valves 205-1 and 205-2 are shown in a left portion of FIG. 1 (an upper portion of FIG. 2). A transfer device 125 serving as a substrate transfer mechanism (also referred to as a "substrate transfer robot") capable of transferring the wafer 200 is provided in the transfer chamber 203. The transfer device 125 includes: a plurality of tweezers (also referred to as "arms") 125a-1 and 125a-2 serving as a placement device on which the plurality of the wafers including the wafer 200 is placed; a transfer mechanism 125b capable of rotating or linearly moving each of the plurality of the tweezers 125a-1 and 125a-2 in a horizontal direction; and a transfer mechanism elevator 125c capable of elevating and lowering the transfer mechanism 125b. By consecutive operations of the plurality of the tweezers 125a-1 and 125a-2, the transfer mechanism 125b and the transfer mechanism elevator 125c, it is possible to charge (load) or discharge (unload) the wafer 200 into or from a component such as a boat 217 serving as a substrate retainer which will be described later and the pod 110. Hereinafter, each of the cases 102-1 and 102-2, the process chambers 201-1 and 201-2 and the plurality of the tweezers 125a-1 and 125a-2 may be simply referred to as a "case" 102, a "process chamber" 201 and "tweezers" 125a, respectively, unless they need to be distinguished separately.

As shown in FIG. 1, in a space above the transfer chamber 203 and below the cleaning mechanism 166, a wafer support 108 is provided on a wafer support table 109. The processed wafer 200 may be placed on the wafer support 108 until it is sufficiently cooled. A structure of the wafer support 108 is similar to that of the boat 217 serving as the substrate retainer which will be described later. The wafer support 108 is configured to support (hold) the plurality of the wafers including the wafer 200 in horizontal orientation in vertically multiple stages by a plurality of wafer supporting grooves (wafer supporting portions). Since the wafer support 108 and the wafer support table 109 are provided above the substrate loading/unloading port 134 and the gate valve 205, the wafer support 108 and the wafer support table 109 deviate from the line of movement of the wafer 200 being transferred from the pod 110 to the process chamber 201 by the transfer device 125. Therefore, it is possible to cool the processed wafer 200 without reducing the throughput of a wafer processing (also referred to as a "substrate processing"). Hereinafter, the wafer support 108 and the wafer support table 109 may be collectively referred to as a "cooling area" or a "cooling region".

In the embodiments, an inner pressure of the pod 110, an inner pressure of the transfer chamber 203 and an inner pressure of the process chamber 201 are all controlled (adjusted) to be equal to or higher than the atmospheric pressure by about 10 Pa to 200 Pa (gauge pressure), respectively. It is preferable that the inner pressure of the transfer chamber 203 is higher than the inner pressure of the process chamber 201, and the inner pressure of the process chamber 201 is higher than the inner pressure of the pod 110.

<Process Furnace>

A process furnace provided with a substrate processing structure as shown in FIG. 3 is disposed in a region "A" surrounded by a broken line in FIG. 1. As shown in FIG. 2, although a plurality of process furnaces is provided according to the embodiments, only one process furnace will be described and the detailed descriptions of the other process furnaces will be omitted since the configurations of the plurality of the process furnaces are all the same. As shown in FIG. 3, the process furnace according to the embodiments includes the case 102 serving as a cavity (process vessel) made of a material such as a metal capable of reflecting the electromagnetic waves. A cap flange (closing plate) 104 made of a metal material is in contact with the case 102 to close (seal) a ceiling surface of the case 102 via an O-ring (not shown) serving as a sealing part. The process chamber 201 in which the wafer 200 such as a silicon wafer is processed is mainly constituted by an inner space enclosed by the case 102 and the cap flange 104. A reaction tube (not shown) made of quartz capable of transmitting the electromagnetic waves may be provided in the case 102. When the reaction tube is provided in the case 102, the process vessel (that is, the case 102) may be configured such that the process chamber 201 is constituted by an inner space of the reaction tube. In addition, the process furnace may not include the cap flange 104. When the cap flange 104 is not included in the process furnace, the process chamber 201 may be defined by the case 102 with a closed ceiling.

A placement table 210 is provided in the process chamber 201. The boat 217 serving as the substrate retainer configured to accommodate the wafer 200 to be processed (or the plurality of the wafers including the wafer 200) is placed on an upper surface of the placement table 210. The wafer 200 to be processed and quartz plates 101a and 101b serving as heat insulating plates are accommodated in the boat 217 with predetermined intervals. The quartz plates 101a and 101b are placed vertically higher than and lower than the wafer 200 (or the plurality of the wafers), respectively, such that the wafer 200 (or the plurality of the wafers) is interposed therebetween. Susceptors (also referred to as an "energy conversion part", a "radiation plate", a "heat equalizing plate" or a "heating element") 103a and 103b capable of indirectly heating the wafer 200 may be provided between each of the quartz plates 101a and 101b and the wafer 200 (or the plurality of the wafers). That is, for example, one of the susceptors 103a and 103b is provided between the quartz plate 101a and the wafer 200, and the other of the susceptors 103a and 103b is provided between the wafer 200 and the quartz plate 101b. For example, the susceptors 103a and 103b are made of a dielectric material such as a dielectric plate capable of self-heating (that is, generating heat) by absorbing the electromagnetic waves. For example, a silicon plate (also referred to as a "Si plate") or a silicon carbide plate (also referred to as a "SiC plate") may be used as the dielectric plate. According to the configuration of the susceptors 103a and 103b described above, it is possible to heat the wafer 200 (or the plurality of the wafers) more uniformly and more efficiently by the radiant heat from the susceptors 103a and 103b. The quartz plate 101a and the quartz plate 101b are identical to each other, and the susceptor 103a and the susceptor 103b are identical to each other, respectively. Therefore, in the embodiments, the quartz plate 101a and the quartz plate 101b may be simply referred to as a quartz plate 101 unless they need to be distinguished separately. Similarly, the susceptor 103a and the susceptor 103b may be simply referred to as a susceptor 103 unless they need to be distinguished separately.

The case 102 serving as the process vessel is a flat and sealed vessel with a circular horizontal cross-section. The transfer housing 202 serving as a transfer vessel is made of a metal material such as aluminum (Al) and stainless steel (SUS), or is made of a material such as quartz. A space surrounded by the case 102 may be referred to as a reaction region 201 or the process chamber 201 serving as a process space, and a space surrounded by the transfer housing 202 may be referred to as the transfer region 203 or the transfer chamber 203 serving as a transfer space. While the process chamber 201 and the transfer chamber 203 are adjacent to each other in the horizontal direction according to the embodiments, the embodiments are not limited thereto. For example, the process chamber 201 and the transfer region 203 may be adjacent to each other in the vertical direction.

As shown in FIGS. 1, 2 and 3, a substrate loading/unloading port 206 is provided at the side wall of the transfer housing 202 adjacent to the gate valve 205. The wafer 200 is moved (transferred) between the process chamber 201 and the transfer chamber 203 through the substrate loading/unloading port 206.

An electromagnetic wave supply mechanism serving as a heating apparatus described later in detail is provided at a side wall of the case 102. The electromagnetic waves such as microwaves supplied through the electromagnetic wave supply mechanism are introduced (supplied) into the process chamber 201 to heat the components such as the wafer 200 and to process the wafer 200.

The placement table 210 is supported by a shaft 255 serving as a rotating shaft. The shaft 255 penetrates a bottom of the case 102 and is connected to a driving mechanism 267 at an outside of the case 102. The driving mechanism 267 is configured to rotate the shaft 255. The wafer 200 (or the plurality of the wafers including the wafer 200) accommodated in the boat 217 may be rotated by rotating the shaft 255 and the placement table 210 by operating the driving mechanism 267. A bellows 212 covers a lower end portion of the shaft 255 to maintain an inside of the process chamber 201 and an inside of the transfer region 203 airtight. The driving mechanism 267 may be configured to elevate and lower the shaft 255. By operating the driving mechanism 267 based on a height of the substrate loading/unloading port 206, the placement table 210 may be elevated or lowered until the upper surface of the placement table 210 reaches the height of the substrate loading/unloading port 206 (hereinafter, also referred to as "wafer transfer position") when the wafer 200 is transferred, and the placement table 210 may be elevated or lowered until the wafer 200 reaches a processing position in the process chamber 201 (hereinafter, also referred to as a "wafer processing position") when the wafer 200 is processed.

An exhaust mechanism configured to exhaust an inner atmosphere of the process chamber 201 is provided below the process chamber 201 on an outer circumference of the placement table 210. As shown in FIG. 3, an exhaust port 221 is provided in the exhaust mechanism. An exhaust pipe 231 is connected to the exhaust port 221. A pressure controller (also referred to as a "pressure adjusting mechanism") 244 such as an APC (Automatic Pressure Controller) valve and a vacuum pump 246 are sequentially connected to the exhaust pipe 231 in series. For example, the APC valve capable of adjusting an opening degree thereof in accordance with the inner pressure of the process chamber 201 may be used as the pressure controller 244. In the present specification, the pressure controller 244 may also be referred to as the APC valve 244. However, in the embodiments, the pressure controller 244 is not limited to the APC valve. The pressure controller 244 may be embodied by a combination of a conventional on-off valve and a pressure regulating valve so long as it is possible to receive information on the inner pressure of the process chamber 201

(that is, a feedback signal from a pressure sensor 245 which will be described later) and to adjust an exhaust amount based on the received information.

The exhaust mechanism (also referred to as an "exhaust system" or an "exhaust line") is configured mainly by the exhaust port 221, the exhaust pipe 231 and the pressure controller 244. It is also possible to configure the exhaust port 221 to surround the placement table 210 such that the gas may be exhausted from the entire circumference of the wafer 200 through the exhaust port 221 surrounding the placement table 210. The exhaust mechanism may further include the vacuum pump 246.

The cap flange 104 is provided with a gas supply pipe 232 configured to supply process gases such as an inert gas, a source gas and a reactive gas used for performing various substrate processing into the process chamber 201. A mass flow controller (MFC) 241 serving as a flow rate controller (flow rate control mechanism) and a valve 243 serving as an opening/closing valve are sequentially installed at the gas supply pipe 232 from an upstream side to a downstream side of the gas supply pipe 232. For example, a nitrogen ($N_2$) gas supply source (not shown) serving as a source of the inert gas is connected to the upstream side of the gas supply pipe 232, and the $N_2$ gas serving as the inert gas is supplied into the process chamber 201 via the MFC 241 and the valve 243. When two or more kinds of gases are used for the substrate processing, it is possible to supply the gases into the process chamber 201 by connecting a gas supply configuration to the gas supply pipe 232 at a downstream side of the valve 243 provided at the supply pipe 232. For example, the gas supply configuration may include a gas supply pipe provided with an MFC and a valve. The MFC serving as a flow rate controller and the valve serving as an opening/closing valve are sequentially installed at the gas supply pipe of the gas supply configuration from an upstream side to a downstream side of the gas supply pipe of the gas supply configuration. For example, the gas supply configuration may include two or more gas supply pipes, each of which is provided with an MFC and a valve, respectively corresponding to the two or more kinds of gases.

A gas supply system (gas supply mechanism) is constituted mainly by the gas supply pipe 232, the MFC 241 and the valve 243. When the inert gas is supplied through the gas supply system, the gas supply system may also be referred to as an inert gas supply system. For example, a rare gas such as argon (Ar) gas, helium (He) gas, neon (Ne) gas and xenon (Xe) gas may be used as the inert gas instead of the $N_2$ gas.

A temperature sensor 263 serving as a non-contact type temperature detector is provided at the cap flange 104. By adjusting the output of a microwave oscillator 655 which will be described later based on the temperature information detected by the temperature sensor 263, the wafer 200 serving as the substrate is heated such that a temperature of the wafer 200 has a desired temperature distribution. For example, the temperature sensor 263 is constituted by a radiation thermometer such as an IR (Infrared Radiation) sensor. The temperature sensor 263 is provided so as to measure a surface temperature of the quartz plate 101*a* or a surface temperature of the wafer 200. When the susceptor 103 serving as the heating element described above is provided, the temperature sensor 263 may measure a surface temperature of the susceptor 103. In the present specification, the term "temperature of the wafer 200" (or wafer temperature) may indicate only a wafer temperature converted by temperature conversion data described later (that is, an estimated wafer temperature), or may indicate only a temperature obtained directly by measuring the temperature of the wafer 200 by the temperature sensor 263, or may indicate both of them.

By acquiring history data of the temperature change of the quartz plate 101 (or the susceptor 103) and the wafer 200 in advance, the temperature conversion data indicating a correlation between a temperature of the quartz plate 101 (or the susceptor 103) and the temperature of the wafer 200 may be stored in a memory device 121*c* or may be stored in an external memory device 123, which will be described later. By preparing the temperature conversion data in advance as described above, it is possible to estimate the temperature of the wafer 200 only by measuring the temperature of the quartz plate 101 (or the susceptor 103) and it is also possible to control the output of the microwave oscillator 655 (that is, to control the heating apparatus) based on the estimated temperature of the wafer 200.

While the radiation thermometer is exemplified as the temperature sensor 263 according to the embodiments, the embodiments are not limited thereto. A thermocouple may be used as the temperature sensor 263 to measure the temperature of the wafer 200, or both the thermocouple and the non-contact type temperature detector (non-contact type thermometer) may be used as the temperature sensor 263 to measure the temperature of the wafer 200. However, when the thermocouple is used as the temperature sensor 263 to measure the temperature of the wafer 200, it is necessary to provide (dispose) the thermocouple in the vicinity of the wafer 200 to measure the temperature the wafer 200. That is, since it is necessary to dispose the thermocouple in the process chamber 201, the thermocouple itself is heated by the microwaves supplied from the microwave oscillator 655 described later. As a result, it is impossible to accurately measure the temperature of the wafer 200. Therefore, it is preferable to use the non-contact type thermometer as the temperature sensor 263. While the temperature sensor 263 is provided at the cap flange 104 according to the embodiments, the embodiments are not limited thereto. For example, the temperature sensor 263 may be provided at the placement table 210. While the temperature sensor 263 is directly disposed at the cap flange 104 or the placement table 210 according to the embodiments, the embodiments are not limited thereto. For example, the temperature sensor 263 may measure the temperature of the wafer 200 indirectly by measuring the radiation reflected by the components such as a mirror and emitted through a measurement window provided in the cap flange 104 or the placement table 210. While only one temperature sensor 263 is shown in FIG. 3 according to the embodiments, the embodiments are not limited thereto. A plurality of temperature sensors may be provided according to the embodiments.

Electromagnetic wave introduction ports 653-1 and 653-2 are provided at the side wall of the case 102. One end of each of waveguides 654-1 and 654-2 configured to supply the electromagnetic waves into the process chamber 201 is connected to the electromagnetic wave introduction port 653-1 or 653-2. The other end of each of the waveguides 654-1 and 654-2 is connected to either of microwave oscillators (hereinafter, also referred to as electromagnetic wave sources) 655-1 and 655-2 serving as heating sources configured to supply the electromagnetic waves into the process chamber 201 to heat the process chamber 201. The microwave oscillators 655-1 and 655-2 supply the electromagnetic waves such as the microwaves to the waveguides 654-1 and 654-2, respectively. For example, a magnetron or a klystron may be used as the microwave oscillators 655-1 and 655-2. In the present specification, unless they need to be distinguished separately, the electromagnetic wave introduction ports 653-1 and 653-2 may be simply referred to as an electromagnetic wave introduction port 653, the waveguides 654-1 and 654-2 may be simply referred to as a waveguide 654, and the microwave oscillators 655-1 and 655-2 may be simply referred to as the microwave oscillator 655.

Preferably, a frequency of the electromagnetic waves generated by the microwave oscillator 655 is controlled such that the frequency is within a range from 13.56 MHz to 24.125 GHz. More preferably, the frequency is controlled to a frequency of 2.45 GHz or 5.8 GHz. In the embodiments, the frequencies of the microwave oscillators 655-1 and 655-2 may be the same or may be different from each other. While the two microwave oscillators 655-1 and 655-2 are provided on the same side wall of the case 102 according to the embodiments, the embodiments are not limited thereto. For example, the microwave oscillator 655 including at least one microwave oscillator may be provided according to the embodiments. In addition, the microwave oscillator 655-1 may be provided on the side wall of the case 102 and the microwave oscillator 655-2 may be provided on another side wall of the case 102 such as a sidewall facing the side wall of the case 102 at which the microwave oscillator 655-1 is provided. The electromagnetic wave supply mechanism serving as the heating apparatus is constituted mainly by the microwave oscillators 655-1 and 655-2, the waveguides 654-1 and 654-2 and the electromagnetic wave introduction ports 653-1 and 653-2. The electromagnetic wave supply mechanism may also be referred to as an electromagnetic wave supply apparatus, a microwave supply mechanism or a microwave supply apparatus.

A controller 121 which will be described later is connected to the microwave oscillators 655-1 and 655-2. The temperature sensor 263 configured to measure the temperature of the wafer 200 or the temperature of the quartz plate 101a (or the quartz plate 101b) is connected to the controller 121. The temperature sensor 263 may be configured to measures the temperature of the quartz plate 101 (or the susceptor 103) or the wafer 200 as described above and to transmit the measured temperature to the controller 121. The controller 121 is configured to control the heating of the wafer 200 by controlling the outputs of the microwave oscillators 655-1 and 655-2. In order to control the heating of the wafer 200 by the heating apparatus, for example, the voltage input to the microwave oscillator 655 may be controlled or a ratio between the time amounts for which the power supply of the microwave oscillator 655 is in an ON state and in an OFF state, respectively, may be changed.

In the embodiments, the microwave oscillators 655-1 and 655-2 are controlled by the same control signal transmitted from the controller 121. However, the embodiments are not limited thereto. For example, the microwave oscillator 655-1 and the microwave oscillator 655-2 may be individually controlled by individual control signals transmitted from the controller 121 to the microwave oscillator 655-1 and the microwave oscillator 655-2, respectively.

<Controller>

Figure 4:
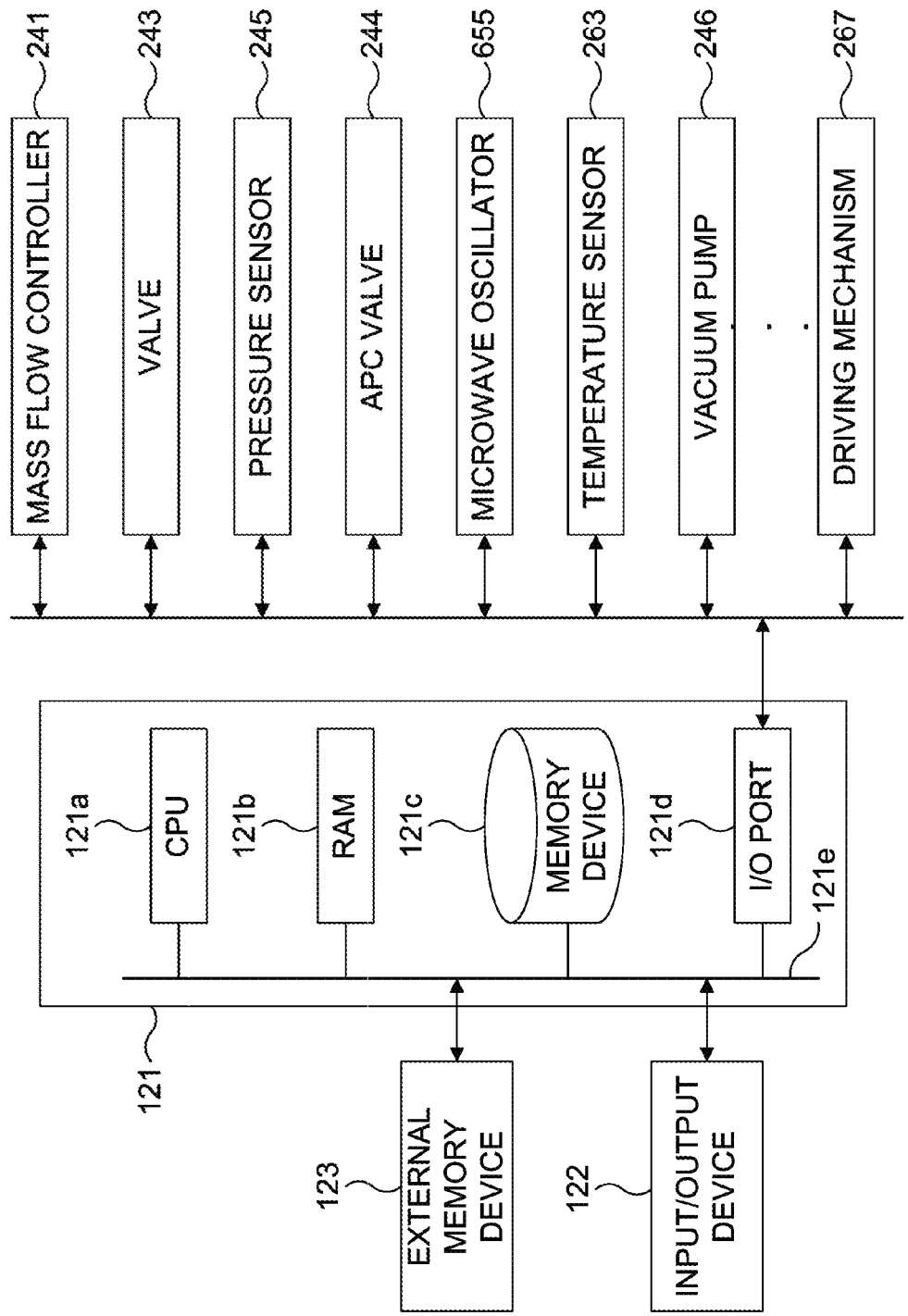
FIG. 4 is a block diagram schematically illustrating a configuration of a controller and related components of the substrate processing apparatus preferably used in the embodiments.

As shown in FIG. 4, the controller 121 serving as a control mechanism (also referred to as a "control apparatus" or a "control device") is constituted by a computer including a CPU (Central Processing Unit) 121a, a RAM (Random Access Memory) 121b, the memory device 121c and an I/O port 121d. The RAM 121b, the memory device 121c and the I/O port 121d may exchange data with the CPU 121a through an internal bus 121e. For example, an input/output device 122 such as a touch panel is connected to the controller 121.

For example, the memory device 121c is configured by components such as a flash memory and HDD (Hard Disk Drive). For example, a control program for controlling the operation of the substrate processing apparatus 100 and a process recipe containing information on the sequences and conditions of an annealing process (modification process) of the substrate processing described later are readably stored in the memory device 121c. The process recipe is obtained by combining steps of the substrate processing described later such that the controller 121 can execute the steps to acquire a predetermine result, and functions as a program. Hereinafter, the process recipe and the control program are collectively referred to as a "program". The process recipe may be simply referred to as a "recipe". In the present specification, the term "program" may indicate only the recipe, may indicate only the control program, or may indicate both of the recipe and the control program. The RAM 121b functions as a memory area (work area) where a program or data read by the CPU 121a is temporarily stored.

The I/O port 121d is connected to the above-described components such as the mass flow controller (MFC) 241, the valve 243, the pressure sensor 245, the APC valve 244, the vacuum pump 246, the temperature sensor 263, the driving mechanism 267 and the microwave oscillator 655.

The CPU 121a is configured to read a control program from the memory device 121c and execute the read control program. Furthermore, the CPU 121a is configured to read a recipe from the memory device 121c according to an operation command inputted from the input/output device 122. According to the contents of the read recipe, the CPU 121a may be configured to control various operations such as flow rate adjusting operations for the various gases by the MFC 241, an opening/closing operation of the valve 243, a pressure adjusting operation by the APC valve 244 based on the pressure sensor 245, a start and stop of the vacuum pump 246, an output adjusting operation by the microwave oscillator 655 based on the temperature sensor 263, an operation of adjusting rotation and rotation speed of the placement table 210 (or an operation of adjusting rotation and rotation speed of the boat 217) by the driving mechanism 267 and an elevating and lowering operation of the placement table 210 (or an elevating and lowering operation of the boat 217) by the driving mechanism 267.

The controller 121 may be embodied by installing the above-described program stored in the external memory device 123 into a computer. For example, the external memory device 123 may include a magnetic disk such as a hard disk, an optical disk such as a CD, a magneto-optical disk such as MO, and a semiconductor memory such as a USB memory. The memory device 121c or the external memory device 123 may be embodied by a non-transitory computer readable recording medium. Hereafter, the memory device 121c and the external memory device 123 are collectively referred to as recording media. In the present specification, the term "recording medium" may indicate only the memory device 121c, may indicate only the external memory device 123 or may indicate both of the memory device 121c and the external memory device 123. Instead of the external memory device 123, a communication means such as the Internet and a dedicated line may be used to provide the program to the computer.

(2) Substrate Processing

Hereinafter, an exemplary sequence of the annealing process of the substrate processing of modifying (crystallizing) a film formed on the wafer 200 serving as the substrate, which is a part of manufacturing processes of a semiconductor device, will be described with reference to a flow chart shown in FIG. 5. For example, the film such as an amorphous silicon film serving as a silicon-containing film is processed according to the substrate processing. The exemplary sequence of the substrate processing is performed by using the process furnace of the substrate processing apparatus 100 described above. Hereinafter, the components of the substrate processing apparatus 100 are controlled by the controller 121. According to the embodiments, processing contents of the substrate processing performed by the plurality of the process furnaces provided in the substrate processing apparatus 100 are all the same. That is, the same recipe is used in the plurality of the process furnaces to perform the substrate processing. Similar to the configurations of the plurality of the process furnaces described above, only the substrate processing performed by one process furnace will be described and the detailed descriptions of the substrate processing performed by the other process furnaces will be omitted.

In the present specification, the term "wafer" may refer to "a wafer itself" or refer to "a wafer and a stacked structure (aggregated structure) of a predetermined layer (or layers) or a film (or films) formed on a surface of the wafer". In addition, "a surface of a wafer" refers to "a surface (exposed surface) of the wafer itself" or "a surface of a predetermined layer (or layers) or a film (or films) formed on the wafer, that is, a top surface of the wafer as a stacked structure". Thus, in the present specification, "forming a predetermined layer (or film) on a wafer" may refer to "forming a predetermined layer (or film) on a surface of the wafer itself" or refer to "forming a predetermined layer (or film) on a surface of another layer or a film formed on the wafer". In the present specification, "substrate" and "wafer" may be used as substantially the same meaning. That is, the term "substrate" may be substituted by "wafer" and vice versa.

<Substrate Loading Step S501>

As shown in FIG. 3, the wafer 200 placed on one of the tweezers 125a-1 and 125a-2 (or two wafers including the wafer 200 placed on both of the tweezers 125a-1 and 125a-2) is transferred (loaded) into the predetermined process chamber 201 while the gate valve 205 is opened by an opening/closing operation of the gate valve 205 (S501).

<Pressure and Temperature Adjusting Step S502>

After the wafer 200 is loaded into the process chamber 201, the inner atmosphere of the process chamber 201 is controlled (adjusted) so that the inner pressure of the process chamber 201 is equal to a predetermined pressure. For example, the predetermined pressure may range from 10 Pa to 102,000 Pa. Specifically, the opening degree of the pressure controller 244 is feedback-controlled based on the pressure information detected by the pressure sensor 245 to adjust the inner pressure of the process chamber 201 to the predetermined pressure while vacuum-exhausting the process chamber 201 by the vacuum pump 246. In addition, the electromagnetic wave supply mechanism may be controlled so as to heat the process chamber 201 to a predetermined temperature as a preliminary heating (S502). When an inner temperature of the process chamber 201 is elevated to a substrate processing temperature by the electromagnetic wave supply mechanism, it is preferable to elevate the inner temperature of the process chamber 201 while the output of the electromagnetic wave supply mechanism is controlled to be less than that of the electromagnetic wave supply mechanism when the modification process described later is performed. In this manner, it is possible to prevent the wafer 200 from being deformed or damaged. In addition, when the substrate processing is performed under the atmospheric pressure, an inert gas supply step S503 described later may be performed after adjusting only the inner temperature of the process chamber 201 without adjusting the inner pressure of the process chamber 201.

<Inert Gas Supplying Step S503>

After the inner pressure and the inner temperature of the process chamber 201 are controlled to predetermined values by the pressure and temperature adjusting step S502, the driving mechanism 267 rotates the shaft 255 and rotates the wafer 200 via the boat 217 on the placement table 210. While the driving mechanism 267 rotates the wafer 200, the inert gas such as the nitrogen gas is supplied into the process chamber 201 through the gas supply pipe 232 (S503). In the inert gas supply step S503, the inner pressure of the process chamber 201 is adjusted to a predetermined pressure. For example, the predetermined pressure of the inert gas supplying step S503 may range from 10 Pa to 102,000 Pa, more preferably, from 101,300 Pa to 101,650 Pa. Alternatively, the driving mechanism 267 may rotate the shaft 255 in the substrate loading step S501, that is, after the wafer 200 is loaded into the process chamber 201.

<Modification Step S504>

While maintaining the inner pressure of the process chamber 201 at a predetermined pressure, the microwave oscillator 655 supplies the microwaves into the process chamber 201 through the above-described components such as the electromagnetic wave introduction port 653 and the waveguide 654. By supplying the microwaves into the process chamber 201, the wafer 200 is heated to a predetermined temperature. For example, the predetermined temperature of the modification step S504 may be within a temperature range of 100° C. to 1,000° C., preferably from 400° C. to 900° C., and more preferably from 500° C. to 700° C. By performing the substrate processing at the temperature described above, it is possible to perform the modification step S504 of the substrate processing at the temperature that the wafer 200 efficiently absorbs the microwaves. Therefore, it is possible to improve the speed of the modification process in the modification step S504. That is, when the wafer 200 is processed at a temperature lower than 100° C. or higher than 1,000° C., a surface of the wafer 200 is deformed, so that the microwave is hardly absorbed on the surface of the wafer 200. This may cause difficulties in heating the wafer 200. Therefore, it is preferable to perform the modification step S504 of the substrate processing at the temperature range described above.

In the embodiments in which the wafer 200 is heated according to a microwave heating method, standing waves may be generated in the process chamber 201 so that a region (also referred to as a "heat concentrated region" or a "hot spot") which is locally heated and a region (also referred to as a "unheated region") which is substantially unheated may be formed on the wafer 200 (and the susceptor 103 in addition to the wafer 200 when the susceptor 103 is accommodated in the boat 217). In order to prevent the wafer 200 (and the susceptor 103 when the susceptor 103 is accommodated in the boat 217) from being deformed, an ON/OFF control of the power supply of the electromagnetic wave supply mechanism may be performed to suppress the generation of the hot spot on the wafer 200 (and the susceptor 103 in addition to the wafer 200 when the susceptor 103 is accommodated in the boat 217).

In the embodiments, as described above, the temperature sensor 263 is a non-contact type temperature sensor. When the wafer 200 serving as an object to be measured (and the susceptor 103 in addition to the wafer 200 when the susceptor 103 is accommodated in the boat 217) is deformed or damaged, measurement conditions such as a position of the wafer 200 monitored by the temperature sensor 263 and a measurement angle with respect to the wafer 200 may be changed. Therefore, the measured value (monitored value) may become inaccurate and the measured temperature may change abruptly. According to the embodiments, it is possible to perform the ON/OFF control of the power supply of the electromagnetic wave supply mechanism by using the abrupt change of the measured temperature of the radiation thermometer (that is, the temperature sensor 263) as a trigger, which occurs when the object to be measured such as the wafer 200 and the susceptor 103 is deformed or damaged.

By controlling the microwave oscillator 655 as described above, the wafer 200 is heated so that the amorphous silicon film formed on the surface of the wafer 200 is modified (crystallized) into a polysilicon film (S504). That is, it is possible to modify the wafer 200 uniformly. In addition, when the measured temperature of the wafer 200 exceeds or falls below the temperature range described above, it is also possible to control the temperature of the wafer 200 to be within the temperature range by decreasing (or increasing) the output of the microwave oscillator 655 instead of turning off (or on) the microwave oscillator 655 by the ON/OFF control. When the temperature of the wafer 200 returns to a temperature within the temperature range after decreasing (or increasing) the output of the microwave oscillator 655, the output of the microwave oscillator 655 may be increased (or decreased).

After a predetermined processing time elapses, the rotation of the boat 217, the supply of the gas, the supply of the microwaves and the exhaust via the exhaust pipe 231 are stopped.

<Substrate Unloading Step S505>

After returning the inner pressure of the process chamber 201 to the atmospheric pressure, the gate valve 205 is opened for the process chamber 201 to communicate with the transfer chamber 203. Thereafter, the wafer 200 placed on the boat 217 is transferred to the transfer chamber 203 by the tweezers 125a of the transfer device 125 (S505).

By performing (or repeating) the above-described steps, the wafer 200 is modified. Then, a next substrate processing may be performed.

(3) Shape of Susceptor and Susceptor Retaining Structure of Boat

Figure 6A:
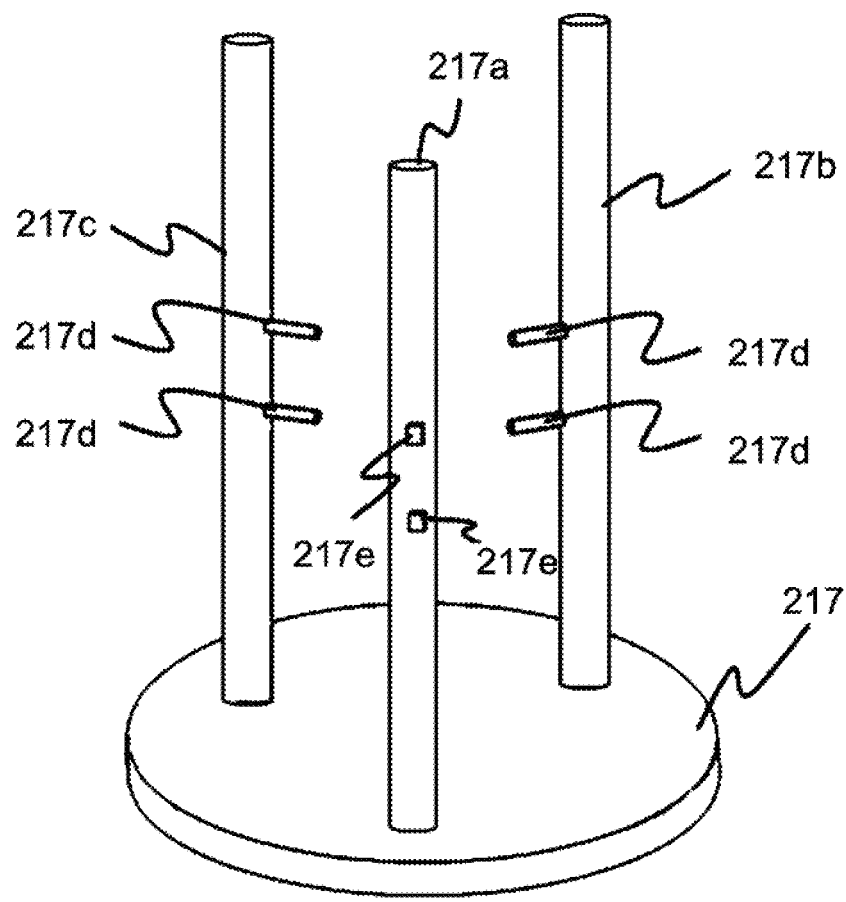
FIG. 6A schematically illustrates a substrate retainer preferably used in the embodiments described herein.
Figure 7A:
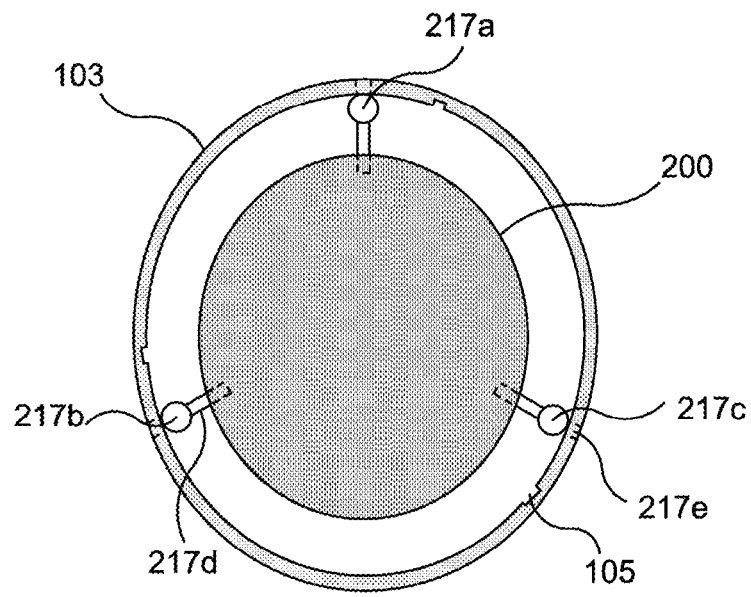
FIG. 7A schematically illustrates a horizontal cross-section of the substrate retainer when the susceptor shown in FIG. 6B is supported by the substrate retainer shown in FIG. 6A.
Figure 7B:
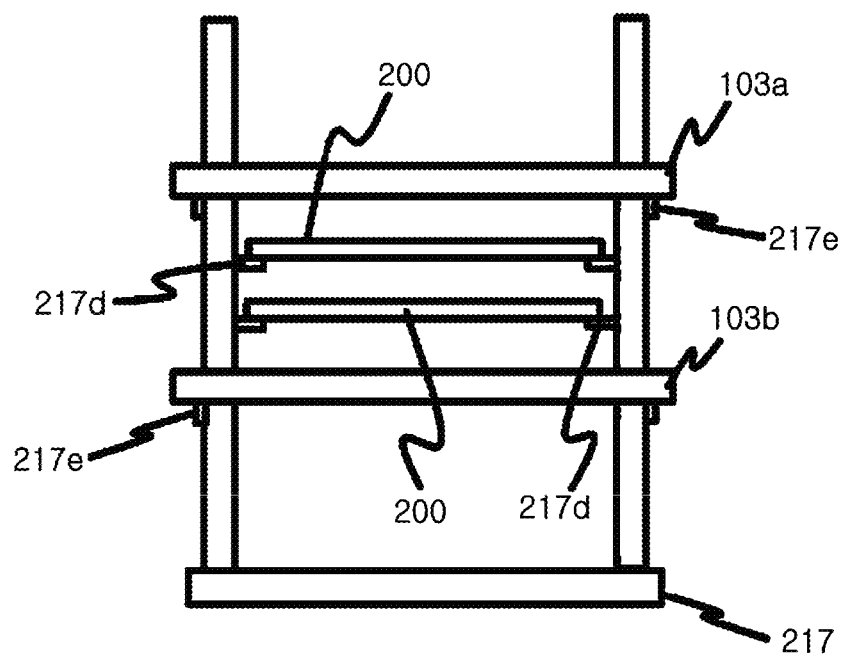
FIG. 7B is a perspective view schematically illustrating the substrate retainer when the susceptor shown in FIG. 6B is supported by the substrate retainer shown in FIG. 6A.

Hereinafter, with reference to FIGS. 6A through and 7B, the shape of the susceptor 103 and an example of a retaining structure of the boat 217 where the susceptor 103 is accommodated will be described. In FIG. 6A, components such as a ceiling plate (end plate) of the boat 217, the quartz plate 101 and supporting portions of the quartz plate 101 are omitted for simplification. As shown in FIG. 6A, the boat 217 may be provided with boat columns (also referred to as "support columns") 217a, 217b and 217c in order to support the plurality of the wafers (for example, two wafers) including the wafer 200. For example, wafer supporting portions (that is, upper wafer supporting portions and lower wafer supporting portions) 217d capable of supporting the plurality of the wafers including the wafer 200 are provided above and below in the vertical direction on a side surface of each of the boat columns 217a through 217c facing the center of the wafer 200. For example, susceptor supporting portions (that is, upper susceptor supporting portions and lower susceptor supporting portions) 217e capable of supporting (holding) the susceptor 103 are provided above and below in the vertical direction on a side surface of each of the boat columns 217a opposite to the side surface of each of the boat columns 217a through 217c facing the center of the wafer 200. In the present specification, the susceptor supporting portions 217e are also referred to as heating element supporting portions. As shown in FIG. 7B, the upper susceptor supporting portions of the susceptor supporting portions 217e are disposed (arranged) higher than the upper wafer supporting portions of the wafer supporting portions 201d. Similarly, the lower susceptor supporting portions of the susceptor supporting portions 217e are disposed (arranged) lower than the lower wafer supporting portions of the wafer supporting portions 201d.

Figure 6B:
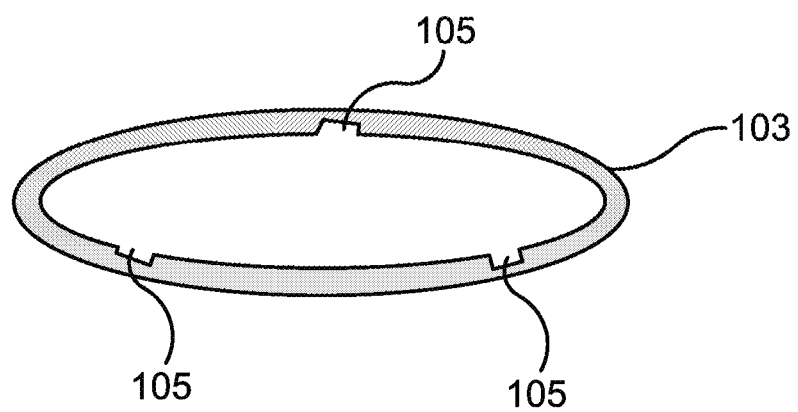
FIG. 6B is a perspective view schematically illustrating a susceptor preferably used in the embodiments described herein.

As shown in FIG. 6B, the susceptor 103 is of an annular shape (ring shape), and notched portions 105 are provided at positions corresponding to the susceptor supporting portions 217e in the inner circumferential portion of the susceptor 103. By providing the notched portions 105 as described above, for example, when the susceptor 103 is inserted from above until being supported by the susceptor supporting portions 217e, the susceptor 103 passes the upper susceptor supporting portions of the susceptor supporting portions 217e through the notched portions 105. After passing the upper susceptor supporting portions of the susceptor supporting portions 217e through the notched portions 105, the susceptor 103 is supported by the lower susceptor supporting portions of the susceptor supporting portions 217e as shown in FIG. 7A by being rotated to a predetermined position. When the susceptor 103 is supported by the lower susceptor supporting portions of the susceptor supporting portions 217e, another susceptor 103 to be supported by the upper susceptor supporting portions of the susceptor supporting portions 217e may be provided without the notched portions 105. However, if the susceptor 103 is inserted from below until being supported by the susceptor supporting portions 217e, all of the susceptors (for example, the susceptors 103a and 103b) should be provide with the notched portions 105.

By providing the susceptor 103 and the boat 217 as described above, as shown in FIGS. 7A and 7B, the wafer 200 and the susceptor 103 are arranged at positions where they are not in contact with each other (also referred to as "non-contacting positions"), and the inner circumferential portion of the susceptor 103 is located outside an outer circumferential portion (also referred to as an "end portion", an "edge portion" or a "circumferential portion") of the wafer 200. As a result, it is possible to suppress an edge effect that the microwaves are concentrated on the outer circumferential portion of the wafer 200, and it is also possible to suppress the outer circumferential portion of the wafer 200 from being excessively modified as compared with other portions of the wafer 200. It is preferable that a gap between an inner circumferential edge of the susceptor 103 and an outer circumferential edge of the wafer 200 is set to be equal to or less than a half wavelength of the microwaves supplied into the process chamber 201 in both the horizontal direction and the vertical direction. When the susceptor 103 and the wafer 200 are disposed so that the gap therebetween is greater than the half wavelength, antinodes of the microwaves with the maximum amplitude of the microwave may be applied to the outer circumferential portion of the wafer 200 a plurality of times. As a result, the suppression of the edge effect may deteriorate. In addition, for the same reason as the gap between the inner circumferential edge of the susceptor 103 and the outer circumferential edge of the wafer 200, it is preferable that a width of a ring of the susceptor 103 is set to be equal to or less than the half wavelength of the microwaves supplied into the process chamber 201. Even when the edge effect occurs in the susceptor 103, its direct influence on modifying the wafer 200 is small. However, when the susceptor 103 is overheated (that is, heated excessively) due to the edge effect in the susceptor 103, the heat generated by the susceptor 103 is greater than required. As a result, the outer circumferential portion of the wafer 200 may become heated more easily. Therefore, it is preferable that the width of the ring of the susceptor 103 is set to a predetermined width equal to or less than the half wavelength of the microwaves.

Figure 8A:
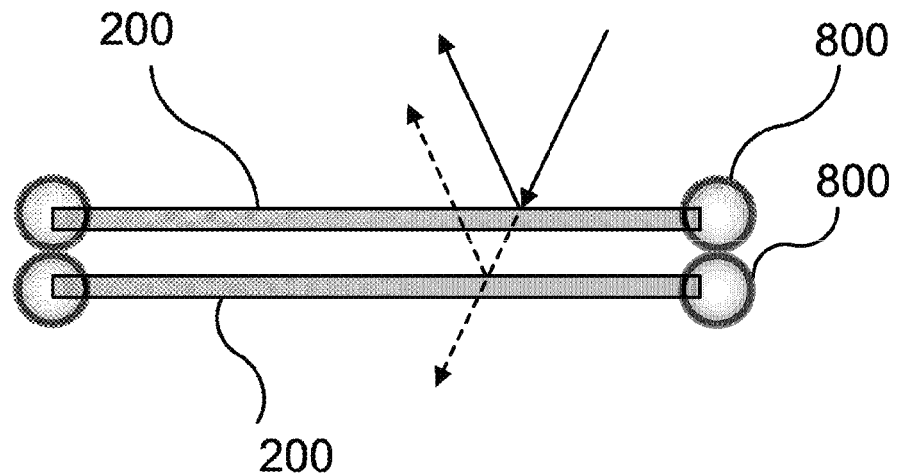
FIG. 8A schematically illustrates an edge effect when the substrate processing according to the embodiments is performed without using the susceptor shown in FIG. 6B.
Figure 8B:
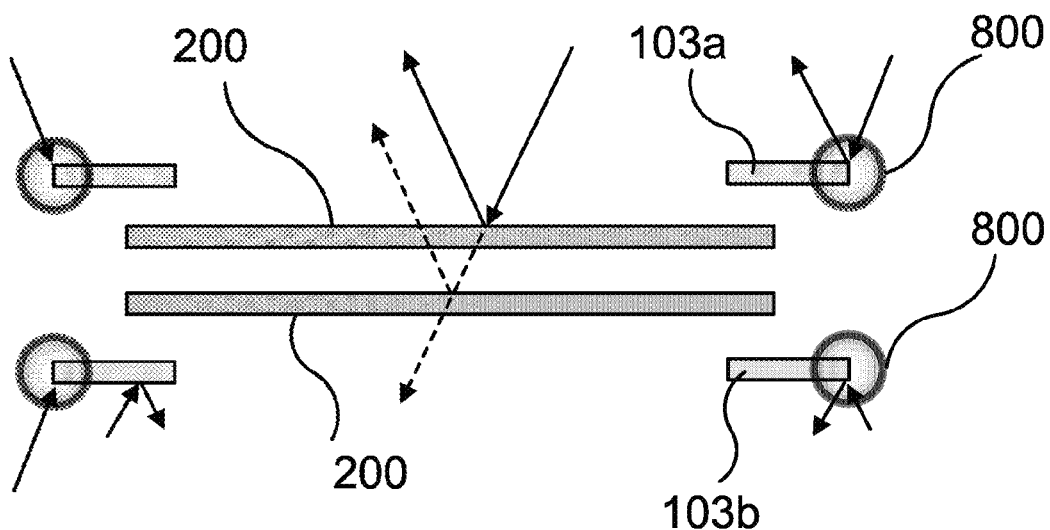
FIG. 8B schematically illustrates an edge effect when the substrate processing according to the embodiments is performed using the susceptor shown in FIG. 6B.
Figure 9A:
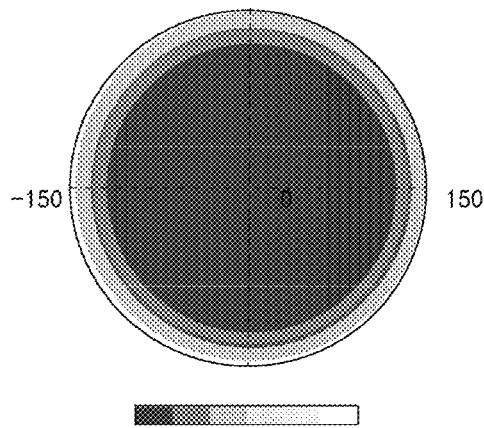
FIG. 9A schematically illustrates a sheet resistance distribution when the substrate processing is performed without using the susceptor.
Figure 9B:
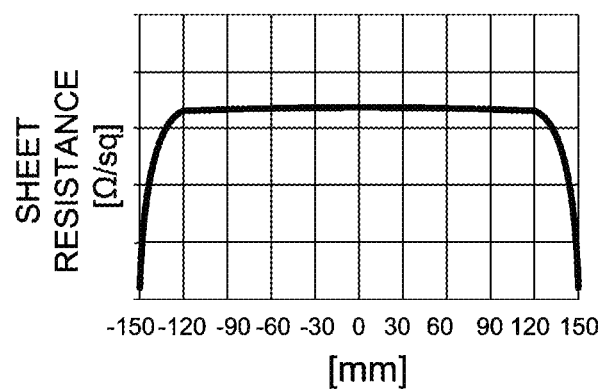
FIG. 9B is a graph schematically illustrating the sheet resistance distribution when the substrate processing is performed without using the susceptor.
Figure 9C:
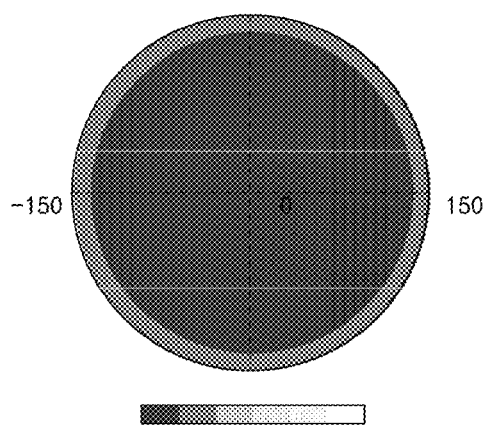
FIG. 9C schematically illustrates a sheet resistance distribution when the substrate processing is performed using the susceptor shown in FIG. 6B.
Figure 9D:
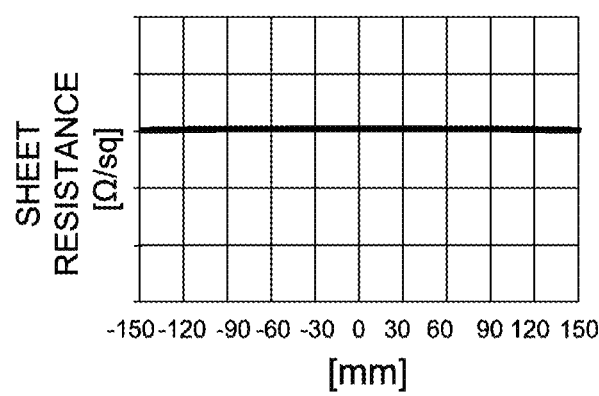
FIG. 9D is a graph schematically illustrating the sheet resistance distribution when the substrate processing is performed using the susceptor shown in FIG. 6B.
Figure 9E:
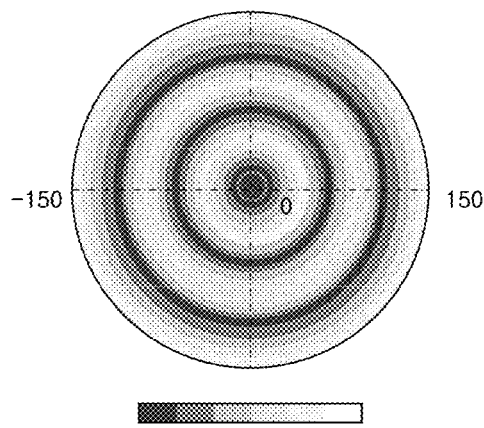
FIG. 9E schematically illustrates a sheet resistance distribution when the substrate processing is performed using a disk-shaped susceptor.
Figure 9F:
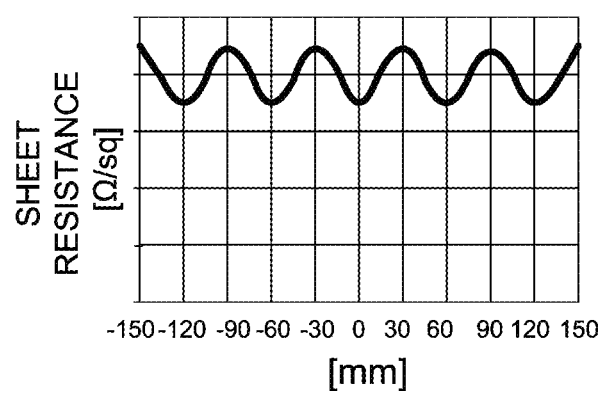
FIG. 9F is a graph schematically illustrating the sheet resistance distribution when the substrate processing is performed using the disk-shaped susceptor.

Results of the substrate processing shown in FIG. 5 when the susceptor 103 is used and when the susceptor 103 is not used will be described with reference to FIGS. 8A through 9F. In FIGS. 8A an 8B, arrows indicated by solid lines or dashed lines schematically illustrate states that microwaves are irradiated (supplied). As shown in FIG. 8A, when the substrate processing shown in FIG. 5 is performed only on the wafer 200 without using the susceptor 103, the microwaves are concentrated on the outer circumferential portion of the wafer 200. As a result, an overheated portion 800 due to the edge effect will occur in the outer circumferential portion of the wafer 200. Therefore, as shown in FIGS. 9A and 9B, only the outer circumferential portion of the substrate (that is, the wafer 200) is modified, and the sheet resistance is extremely low only at the outer circumferential portion of the substrate (that is, the wafer 200). However, as shown in FIG. 8B, when the susceptor 103 of the ring shape is placed at the position where it is not in contact with the wafer 200, the overheated portion 800 due to the edge effect occurs in the outer circumferential portion of the susceptor 103 instead of the outer circumferential portion of the wafer 200. Therefore, it is possible to suppress the edge effect generated in the outer circumferential portion of the wafer 200. When the susceptor 103 is placed as described above, as shown in FIGS. 9C and 9D, the entirety of the wafer 200 is uniformly modified, and the sheet resistance of the wafer 200 is obtained uniformly on the entirety of the wafer 200. When a susceptor of a simple plate shape is used instead of the susceptor 103 of the ring shape, as shown in FIGS. 9E and 9F, the heat generated on the susceptor of the simple plate shape may vary on a surface of the susceptor of the simple plate shape according to the distances between the nodes and the antinodes of the microwaves supplied into the process chamber 201. As a result, modified regions and unmodified regions are formed as concentric circles (stripes) on the surface of the wafer 200. Therefore, in order to improve a processing uniformity on the surface of the wafer 200, it is preferable to use the susceptor 103 of the ring shape with a cut-out portion facing the wafer 200. In addition, when the susceptor 103 and the wafer 200 are arranged so as to be in contact with each other, the heat generated in the susceptor 103 by the edge effect may be transferred to the wafer 200, and a portion of the wafer 200 where the heat is transferred may be more easily heated than the other portions of the wafer 200. Therefore, it is necessary that the susceptor 103 and the wafer 200 are not in contact with each other. According to the embodiments, the susceptor 103 is exemplified as the susceptor of the ring shape with a circular outer circumference. However, the outer circumference of the susceptor 103 is not limited thereto. For example, the outer circumference of the susceptor 103 may be polygonal or of any other shape.

(4) Effects According to the Embodiments

According to the embodiments, it is possible to provide one or more advantageous effects described below.

(a) It is possible to suppress the excessive heating generated at the peripheral portion of the wafer 200 due to the microwaves, and it is also possible to process the wafer 200 uniformly.

(b) By supporting (holding) the wafer 200 and the susceptor 103 at different heights in the substrate retainer (that is, the boat 217), it is possible to support (hold) the wafer 200 and the susceptor 103 by using the substrate retainer with a simple structure without interfering with the transfer of the wafer 200.

(c) By using the susceptor 103 of the ring shape, it is possible to heat the wafer 200 uniformly, and it is also possible to improve the processing uniformity on the surface of the wafer 200.

(d) By arranging the wafer 200 and the susceptor 103 so as not to be in contact with each other, it is possible to prevent (suppress) the energy of the overheated portion generated in the susceptor 103 from being transferred to the wafer 200, which makes it possible to process the wafer 200 uniformly.

While the embodiments are described by way of an example in which the substrate processing apparatus 100 is used to perform the substrate processing, the embodiments are not limited thereto. The embodiments may be modified as in the following modified examples.

First Modified Example

Figure 10A:
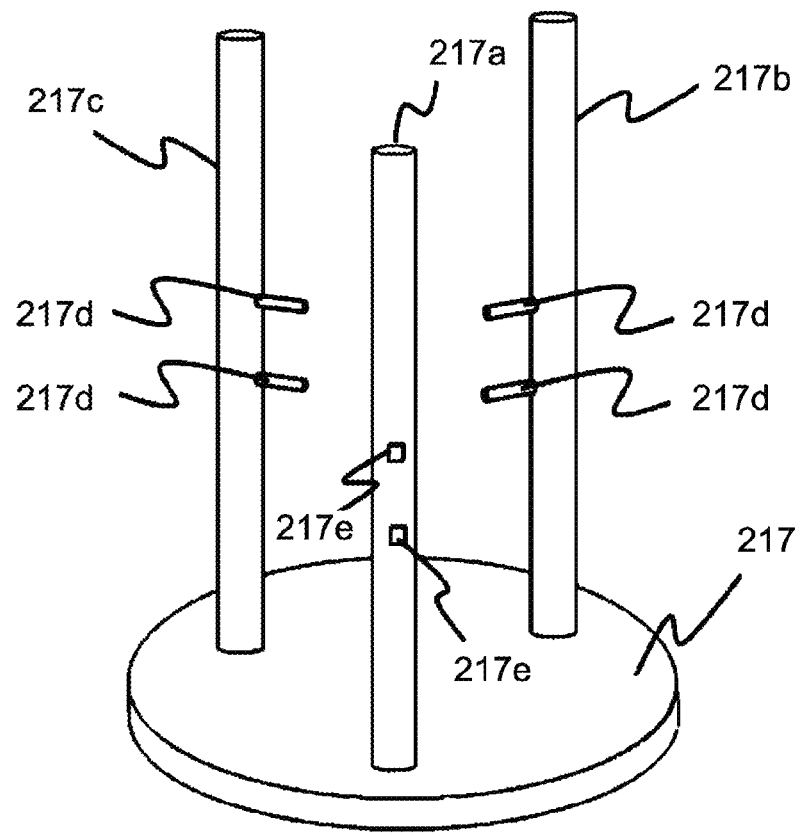
FIG. 10A schematically illustrates a substrate retainer preferably used in a first modified example of the embodiments described herein.
Figure 10B:
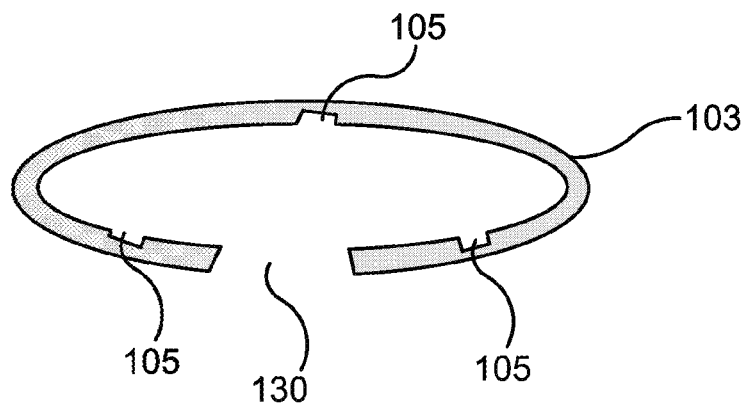
FIG. 10B is a perspective view schematically illustrating a susceptor preferably used in the first modified example of the embodiments described herein.
Figure 11A:
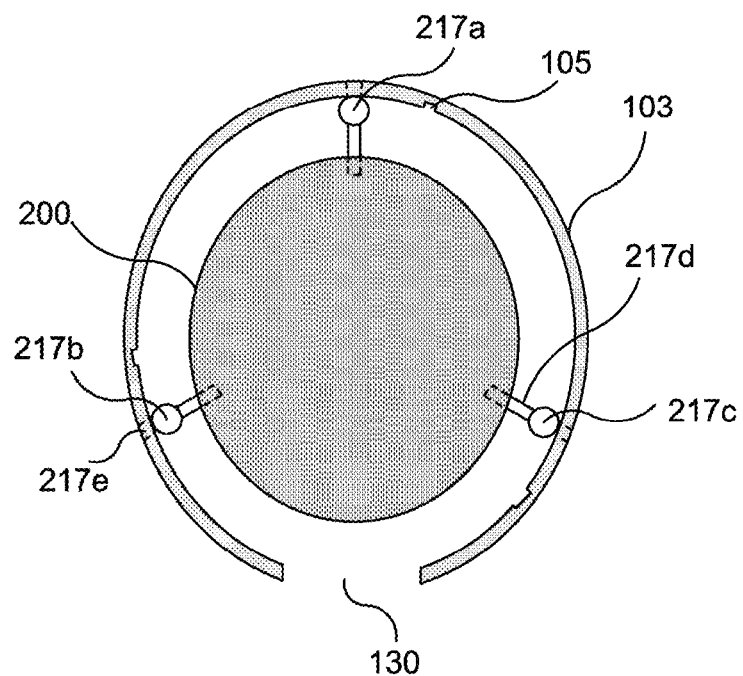
FIG. 11A schematically illustrates a horizontal cross-section of the substrate retainer shown in FIG. 10A when the susceptor shown in FIG. 10B is supported by the substrate retainer shown in FIG. 10A.
Figure 11B:
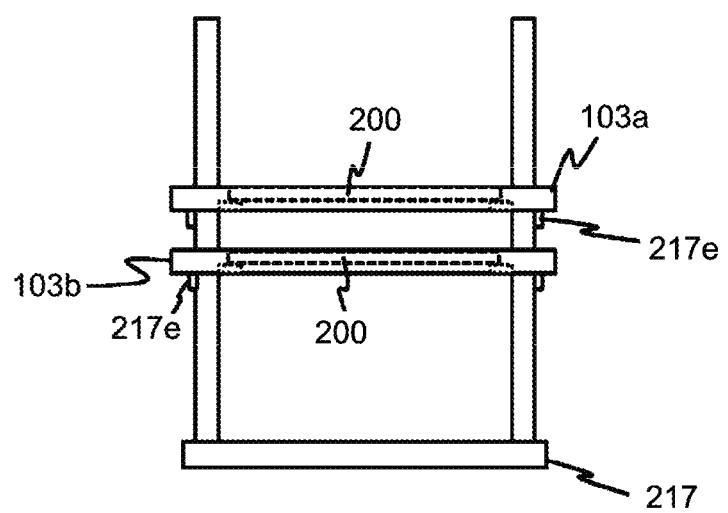
FIG. 11B is a perspective view schematically illustrating the substrate retainer shown in FIG. 10A when the susceptor shown in FIG. 10B is supported by the substrate retainer shown in FIG. 10A.

As shown in FIGS. 10A through 11B, according to a first modified example of the embodiments, the susceptor supporting portions 217e are disposed at the same height as the wafer supporting portions 217d, and the susceptor 103 is provided with a relief portion 130 for the tweezers 125a. The tweezers 125a may move away from the susceptor 103 through the relief portion 130 without contacting the susceptor 103 when the wafer 200 is being transferred. According to the configuration of the first modified example described above, it is possible to arrange the wafer 200 and the susceptor 103 so as not to be in contact with each other, and it is also possible to dispose the susceptor supporting portions 217e and the wafer supporting portions 217d substantially at the same height in the vertical direction. It is also possible to further reduce the edge effect generated in the wafer 200 since the gap between the inner circumferential edge (inner circumferential portion) of the susceptor 103 and the outer circumferential edge (the outer circumferential portion) of the wafer 200 can be easily narrowed. In addition, since it is possible to shorten a length of the boat 217 in the vertical direction, it is possible to shorten a height of the process chamber 201, that is, a height of the case 102. Therefore, it is possible to prevent (suppress) the structure of the semiconductor processing apparatus from being enlarged. In FIG. 10A, components such as the ceiling plate (end plate) of the boat 217 and the supporting portions of the quartz plate 101 are omitted for simplification.

Second Modified Example

As shown in FIGS. 12A through 13B, according to a second modified example of the embodiments, a susceptor boat 136 is configured separately from the boat 217 capable of supporting (accommodating or holding) the wafer 200, wherein the susceptor boat 136 serves as a susceptor retainer capable of supporting (accommodating or holding) the susceptor 103 made of a material such as quartz that transmits the microwaves are separately provided. Further, a mechanism capable of elevating and lowering the susceptor boat 136 is also provided.

Figure 12A:
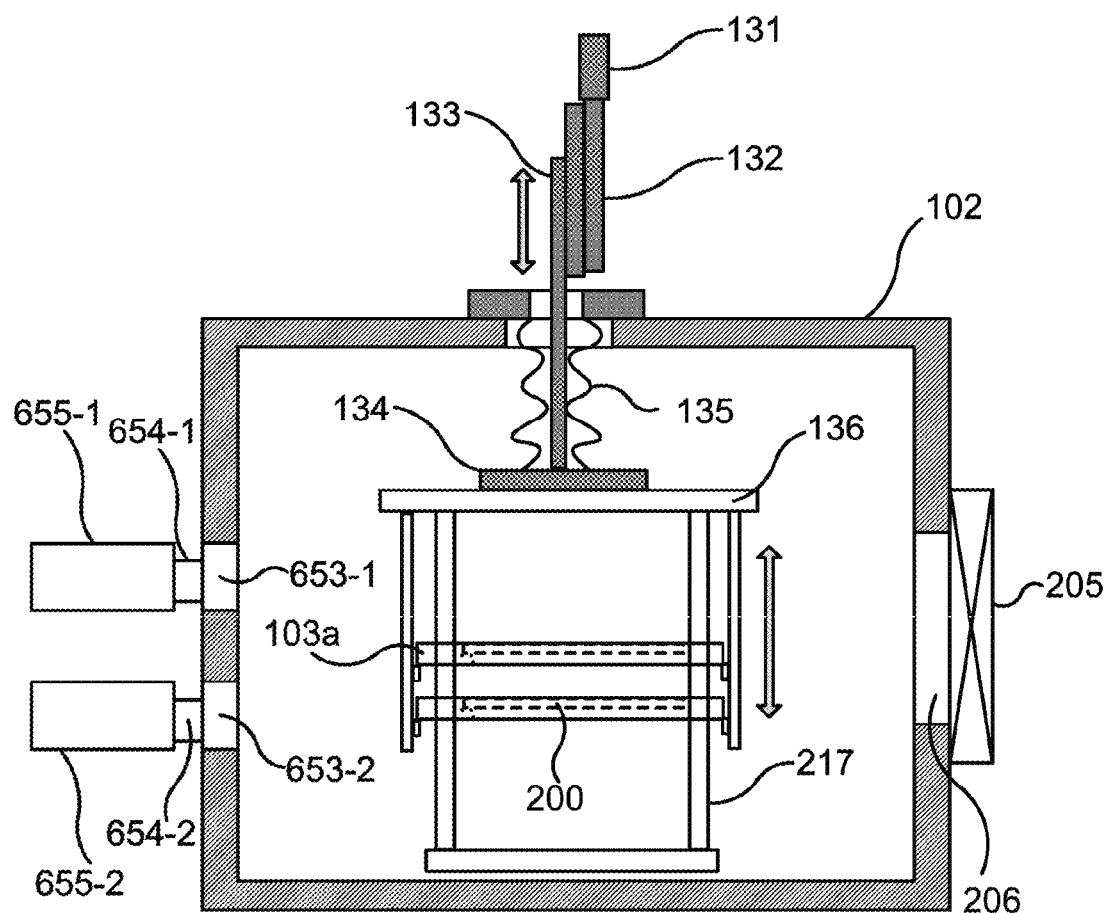
FIG. 12A schematically illustrates a substrate retainer structure preferably used in a second modified example of the embodiments described herein.

A structure of the susceptor boat 136 will be described with reference to FIGS. 12A through and 13B. Provided at the susceptor boat 136, as shown in FIG. 12A, are: a mounting flange 134 attached to an upper surface of the susceptor boat 136; a shaft 133 connected to the mounting flange 134 to elevate and lower the susceptor boat 136; a slider (also referred to as a "susceptor boat elevator") 132 serving as an elevating mechanism of elevating and lowering the susceptor boat 136 via the shaft 133; and a motor 131 capable of driving the slider 132. In addition, an expandable bellows 135 covers the periphery of the shaft 133 disposed in the process chamber 201 to maintain the inside of the process chamber 201 and the inside of the transfer region 203 airtight. A susceptor boat elevating mechanism (also referred to as a "susceptor boat elevating apparatus") is constituted mainly by the motor 131, the slider 132 and the shaft 133. The susceptor boat elevating mechanism may further include the mounting flange 134 and the bellows 135.

Figure 13A:
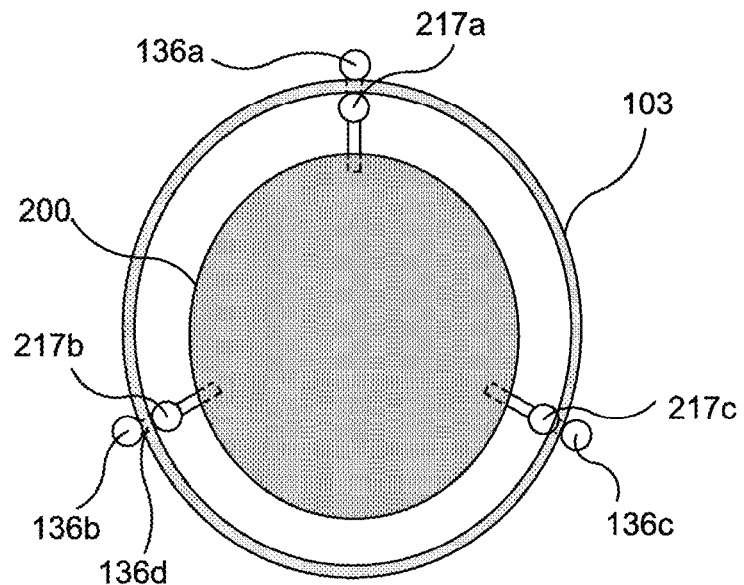
FIG. 13A schematically illustrates a horizontal cross-section of the substrate retainer structure shown in FIG. 12A when the susceptor shown in FIG. 12B is supported by the substrate retainer structure shown in FIG. 12A.

As shown in FIG. 13A, the susceptor boat 136 is provided with susceptor boat columns 136a, 136b and 136c arranged at the same angle as the boat columns 217a through 217c, and susceptor supporting portions (that is, upper susceptor supporting portions and lower susceptor supporting portions) 136d are provided on side surfaces of the susceptor boat columns 136a through 136c facing the center of the wafer 200. It is not necessary to arrange (provide) the susceptor boat columns 136a through 136c at the same angle as the boat columns 217a through 217c. However, in consideration of the influence of the transmittance of the microwaves on the heating of the wafer 200, it is preferable that the susceptor boat columns 136a through 136c are arranged at the same angle as the boat columns 217a through 217c.

Figure 12B:
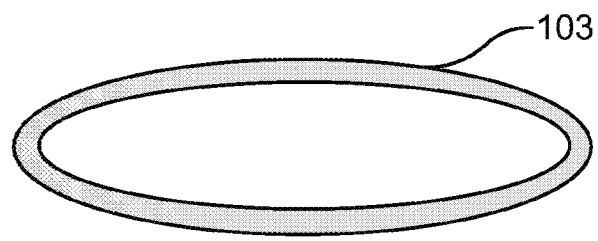
FIG. 12B is a perspective view schematically illustrating a susceptor preferably used in the second modified example of the embodiments described herein.
Figure 13B:
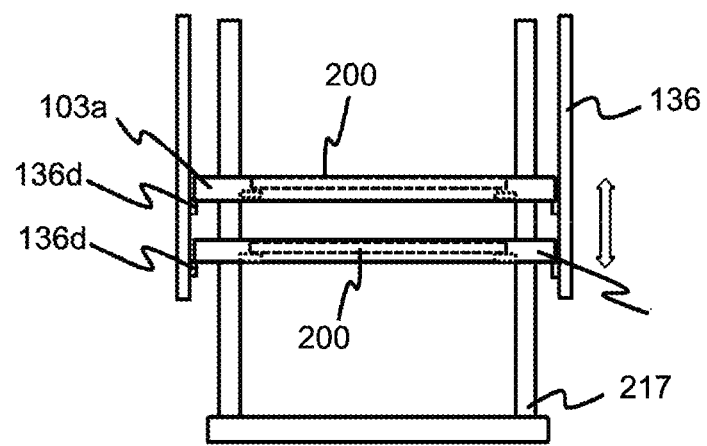
FIG. 13B is a perspective view schematically illustrating the substrate retainer structure shown in FIG. 12A when the susceptor shown in FIG. 12B is supported by the substrate retainer structure shown in FIG. 12A.

As shown in FIG. 13B, with the susceptor 103 supported by the susceptor supporting portions 136d, the susceptor boat 136 is vertically moved up (elevated) and down (lowered) via the shaft 133 and the mounting flange 134 by consecutive operations of the motor 131 and the slider 132. By elevating and lowering the susceptor boat 136, the susceptor 103 supported by the susceptor boat 136 during the substrate processing is disposed at substantially the same height as the wafer 200. In addition, it is possible to reduce the edge effect generated on the outer circumferential portion of the wafer 200 similar to the first modified example described above since the wafer 200 and the susceptor 103 can be arranged so as not to be in contact with each other. As shown in FIG. 12B, according to the second modified example, it is not necessary to provide the notched portions 105 or the relief portion 130 in the susceptor 103 as the first modified example. According to the second modified example, when the susceptor 103 is placed, the slider 132 may move the susceptor boat 136 such that the susceptor supporting portions 136d of the susceptor boat 136 reach higher than an upper surface of the boat 217.

Other Embodiments

While the technique is described by way of the embodiments and the modified examples, the above-described technique is not limited thereto. The above-described technique may be modified in various ways without departing from the gist thereof. For example, the embodiments and the modified examples described above may be appropriately combined. It is possible to obtain the same advantageous effects when the embodiments and the modified examples are appropriately combined.

For example, the embodiments and the modified examples are described by way of an example in which the susceptor 103 is supported (held) by the boat columns 217a through 217c (that is, the wafer 200 and the susceptor 103 are supported by the boat columns 217a through 217c interposed therebetween) at a radially outer side of the boat columns 217a through 217c. However, the above-described technique is not limited thereto. For example, the above-described technique may be applied when the susceptor supporting portions 217e are disposed at a radially inner side of the boat columns 217a through 217c, and the wafer 200 and the susceptor 103 are disposed at the radially inner side of the boat columns 217a through 217c. In addition, when the wafer 200 and the susceptor 103 are disposed at the radially inner side of the boat columns 217a through 217c, the wafer 200 and the susceptor 103 may be supported by the same supporting portions without separately providing the susceptor supporting portions 217e.

For example, the embodiments and the modified examples are described by way of an example in which the plurality of the wafers (for example, two wafers as shown in FIG. 3) including the wafer 200 is simultaneously batch-processed by placing the plurality of the wafers (for example, two wafers) including the wafer 200 on the boat 217. However, the above-described technique is not limited thereto. For example, the above-described technique may also be applied to a case where only a single wafer 200 is placed on the boat 217 for the substrate processing, or the wafer 200 and a dummy wafer (not shown) are placed on the boat 217 for the substrate processing. By processing the substrate (that is, the wafer 200) using the dummy wafer, the heat capacity in the process chamber 201 can be approximated to the case where the two wafers including the wafer 200 are placed on the boat 217 to be processed. In addition, it is possible to obtain processing results similar to the case where only the wafer 200 is placed on the boat 217 for the substrate processing or the wafer 200 and the dummy wafer are placed on the boat 217 for the substrate processing.

For example, the embodiments and the modified examples are described by way of an example in which the amorphous silicon film serving as a film containing silicon as a main element is modified into the polysilicon film. However, the above-described technique is not limited thereto. The above-described technique may be applied to modify a film formed on the surface of the wafer 200 by supplying a gas containing at least one among oxygen (O), nitrogen (N), carbon (C) and hydrogen (H). When, for example, forming a hafnium oxide film ($Hf_xO_y$ film) serving as a high dielectric film on the wafer 200, the deficient oxygen in the hafnium oxide film can be supplemented and the characteristics of the high dielectric film can be improved by supplying the microwaves to heat the wafer 200 while supplying a gas containing oxygen. While the hafnium oxide film is mentioned above as an example, the above-described technique is not limited thereto. For example, the above-described technique may be applied to modify a metal-based oxide film, that is, an oxide film containing at least one metal element such as aluminum (Al), titanium (Ti), zirconium (Zr), tantalum (Ta), niobium (Nb), lantern (La), cerium (Ce), yttrium (Y), barium (Ba), strontium (Sr), calcium (Ca), lead (Pb), molybdenum (Mo) and tungsten (W). That is, the above described substrate processing may be preferably applied to modify a film formed on the wafer 200 such as a TiOCN film, a TiOC film, a TiON film, a TiO film, a ZrOCN film, a ZrOC film, a ZrON film, a ZrO film, a HfOCN film, a HfOC film, a HfON film, a HfO film, a TaOCN film, a TaOC film, a TaON film, a TaO film, a NbOCN film, NbOC film, a NbON film, a NbO film, a AlOCN film, a AlOC film, a AlON film, a AlO film, a MoOCN film, a MoOC film, a MoON film, a MoO film, a WOCN film, a WOC film, a WON film and a WO film.

Without being limited to the high dielectric film, it is also possible to heat a film containing silicon as a main element and doped with impurities. A silicon-based film such as a silicon nitride film (SiN film), a silicon oxide film (SiO film), a silicon oxycarbide film (SiOC film), a silicon oxycarbonitride film (SiOCN film) and a silicon oxynitride film (SiON film) may be used as the above-mentioned film containing silicon as the main element. For example, the impurities may include at least one element such as boron (B), carbon (C), nitrogen (N), aluminum (Al), phosphorus (P), gallium (Ga) and arsenic (As).

In addition, the above-described technique may be applied to modify a photoresist film based on at least one photoresist such as methyl methacrylate resin (polymethyl methacrylate, PMMA), epoxy resin, novolac resin and polyvinyl phenyl resin.

While the embodiments and the modified examples are described by way of an example in which the substrate processing is performed as one of the manufacturing processes of the semiconductor device, the above-described technique is not limited thereto. For example, the above-described technique may be applied to a substrate processing such as patterning process of a manufacturing process of a liquid crystal panel, a patterning process of a manufacturing process of a solar cell and a patterning process of a manufacturing process of a power device.

As described above, according to some embodiments in the present disclosure, it is possible to process the substrate uniformly using the microwaves.

What is claimed is:

1. A substrate retainer configured to support a heating element used in a substrate processing apparatus configured to heat a substrate supported by the substrate retainer by microwaves and process the substrate, the heating element comprising:
a dielectric material of an annular shape capable of generating heat by the microwaves, wherein an inner circumferential portion of the heating element is located outer than an outer circumferential portion of the substrate, and the heating element is supported by the substrate retainer at a position above the substrate and without contacting the substrate.

2. The substrate retainer of claim 1, wherein the heating element further comprises:
a first heating element supported by the substrate retainer at the position above the substrate: and
a second heating element supported by the substrate retainer at a position below the substrate.

3. The substrate retainer of claim 2, wherein a plurality of substrates including the substrate are supported between the first heating element and the second heating element.

4. The substrate retainer of claim 1, wherein the heating element is supported by the substrate retainer at a height different from where the substrate is supported by the substrate retainer.

5. The substrate retainer of claim 1, wherein a width of the heating element is equal to or less than a half wavelength of the microwaves.

6. The substrate retainer of claim 1, wherein the heating element is supported by the substrate retainer such that a gap between the inner circumferential portion of the heating element and the outer circumferential portion of the substrate is equal to or less than a half wavelength of the microwaves.

7. The substrate retainer of claim 1, wherein the heating element further comprises notched portions provided in the inner circumferential portion of the heating element at positions corresponding to heating element supporting portions.

8. The substrate retainer of claim 1, wherein the heating element is supported by heating element supporting portions provided at a radially outer side of support columns.

9. A substrate processing apparatus comprising:
a substrate retainer capable of supporting a substrate;
a process chamber where the substrate retainer is accommodated and the substrate is processed;
a heater capable of heating the substrate by microwaves; and
a heating element of an annular shape, made of a dielectric material capable of generating heat by the microwaves,
wherein an inner circumferential portion of the heating element is located outer than an outer circumferential portion of the substrate, and the heating element is supported by the substrate retainer at a position above the substrate and without contacting the substrate.

10. The substrate processing apparatus of claim 9, wherein the substrate retainer comprises at least two support columns, and
each of the at least two support columns comprises:
an inner side surface;
an outer side surface;
substrate supporting portions capable of supporting the substrate and provided on the inner side surface; and
heating element supporting portions capable of supporting the heating element and provided on the outer side surface.

11. The substrate processing apparatus of claim 10, wherein the substrate supporting portions and the heating element supporting portions are provided at different heights.

12. The substrate processing apparatus of claim 10, wherein the heating element comprises notched portions provided in the inner circumferential portion of the heating element at positions corresponding to the heating element supporting.

13. The substrate processing apparatus of claim 10, wherein the heating element is supported by the heating element supporting portions provided at a radially outer side of support columns.

14. The substrate processing apparatus of claim 9, wherein the heating element comprises:
a first heating element supported by the substrate retainer at the position above the substrate; and
a second heating element supported by the substrate retainer at a position below the substrate.

15. The substrate processing apparatus of claim 14, wherein a plurality of substrates including the substrate are supported between the first heating element and the second heating element.

16. The substrate processing apparatus of claim 9, wherein a width of the heating element is equal to or less than a half wavelength of the microwaves.

17. The substrate processing apparatus of claim 9, wherein the heating element is supported by the substrate retainer such that a gap between the inner circumferential portion of the heating element and the outer circumferential portion of the substrate is equal to or less than a half wavelength of the microwaves.

18. A method of manufacturing a semiconductor device comprising:
(a) loading a substrate into a process chamber of a substrate processing apparatus, the substrate processing apparatus comprising:
a substrate retainer capable of supporting theft substrate;
a process chamber where the substrate retainer is accommodated and the substrate is processed;
a heater capable of heating the substrate by microwaves; and
a heating element of an annular shape, made of a dielectric material capable of generating heat by the microwaves, wherein an inner circumferential portion of the heating element is located outer than an outer circumferential portion of the substrate, and the heating element is supported by the substrate retainer at a position above the substrate and without contacting the substrate;
(b) processing the substrate by supplying the microwaves to heat the substrate and the heating element; and
(c) unloading the substrate after (b).

* * * * *